United States Patent
Liu et al.

(10) Patent No.: US 9,153,478 B2
(45) Date of Patent: Oct. 6, 2015

(54) SPACER ETCHING PROCESS FOR INTEGRATED CIRCUIT DESIGN

(71) Applicant: Taiwan Semiconductor Manufacturing Company, Ltd., Hsin-Chu (TW)

(72) Inventors: Ru-Gun Liu, Zhubei (TW); Shih-Ming Chang, Zhubei (TW); Ken-Hsien Hsieh, Taipei (TW); Ming-Feng Shieh, Tainan County (TW); Chih-Ming Lai, Hsinchu (TW); Tsai-Sheng Gau, Hsinchu (TW); Chia-Ying Lee, New Taipei (TW); Jyu-Horng Shieh, Hsin-Chu (TW); Chung-Ju Lee, Hsinchu (TW); Cheng-Hsiung Tsai, Miaoli County (TW); Tien-I Bao, Taoyuan County (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/081,345

(22) Filed: Nov. 15, 2013

(65) Prior Publication Data
US 2014/0273442 A1    Sep. 18, 2014

Related U.S. Application Data

(60) Provisional application No. 61/791,138, filed on Mar. 15, 2013.

(51) Int. Cl.
*H01L 21/00* (2006.01)
*H01L 21/768* (2006.01)
*H01L 21/033* (2006.01)
*H01L 21/311* (2006.01)

(52) U.S. Cl.
CPC ...... *H01L 21/76816* (2013.01); *H01L 21/0337* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 7,862,962 | B2 | 1/2011 | Shieh et al. |
| 7,989,355 | B2 | 8/2011 | Shieh et al. |
| 8,039,179 | B2 | 10/2011 | Shieh et al. |
| 8,110,466 | B2 | 2/2012 | Shieh et al. |
| 8,241,823 | B2 | 8/2012 | Shieh et al. |
| 2012/0100673 | A1 | 4/2012 | Shieh et al. |

(Continued)

OTHER PUBLICATIONS

Ming-Feng Shieh et al, U.S. Appl. No. 13/892,945, filed May 13, 2013, for "Method of Fabricating a FinFET Device," 16 pages of text, 10 pages of drawings.

*Primary Examiner* — Charles Garber
*Assistant Examiner* — Brigitte Paterson
(74) *Attorney, Agent, or Firm* — Haynes and Boone, LLP

(57) ABSTRACT

A method of forming a target pattern includes forming a first material layer on a substrate; performing a first patterning process using a first layout to form a first plurality of trenches in the first material layer; performing a second patterning process using a second layout to form a second plurality of trenches in the first material layer; forming spacer features on sidewalls of both the first plurality of trenches and the second plurality of trenches, the spacer features having a thickness; removing the first material layer; etching the substrate using the spacer features as an etch mask; and thereafter removing the spacer features. The target pattern is to be formed with the first layout and the second layout.

20 Claims, 12 Drawing Sheets

(56) References Cited

U.S. PATENT DOCUMENTS

2013/0029436 A1\* 1/2013 Fujita .............................. 438/8
2013/0232456 A1\* 9/2013 Kallingal et al. ............... 716/53
2013/0270716 A1\* 10/2013 Kim et al. ..................... 257/775

\* cited by examiner

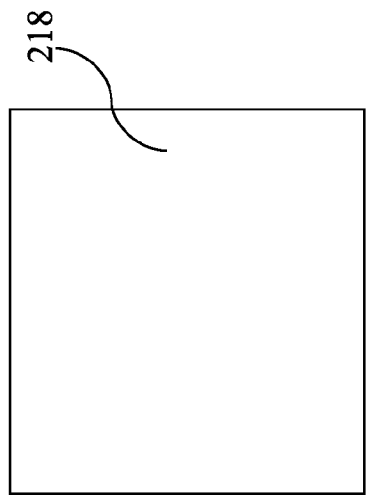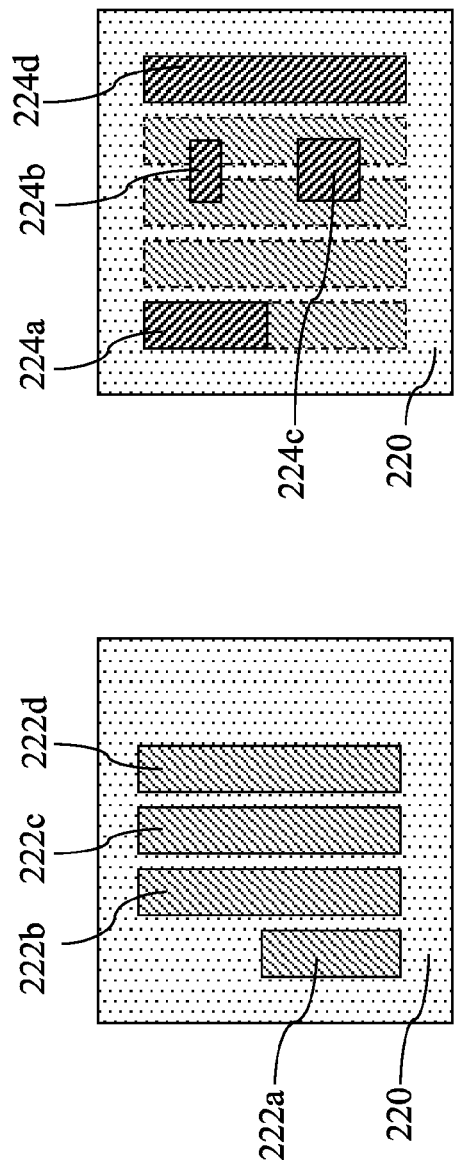

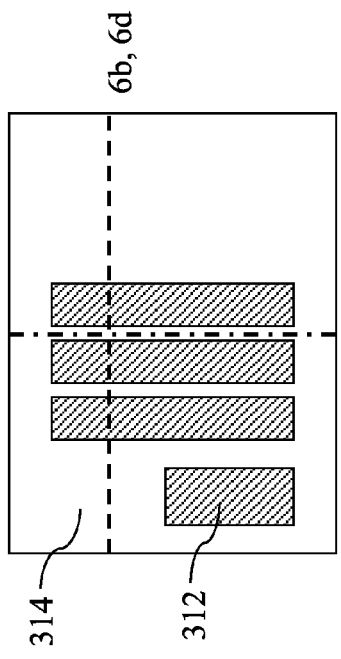
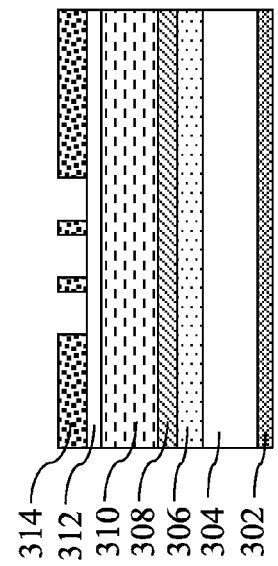
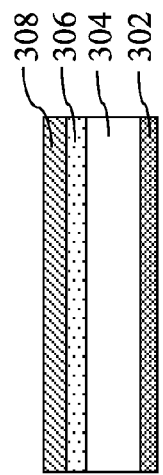
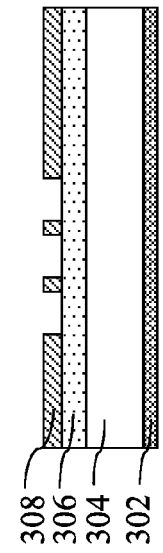
FIG. 6a
FIG. 6b
FIG. 6c
FIG. 6d
FIG. 6e

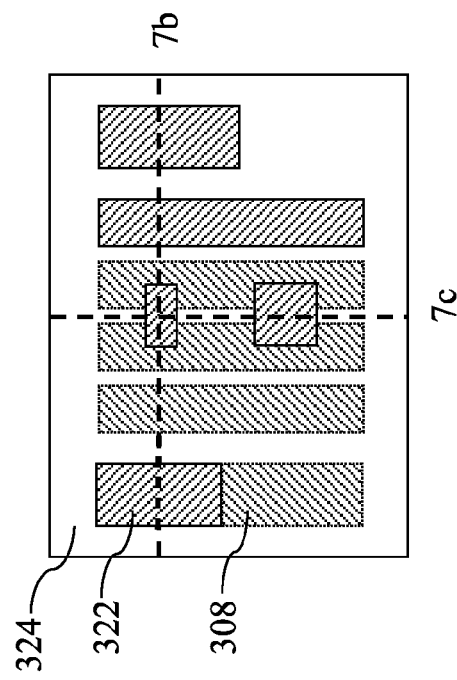
FIG. 7a
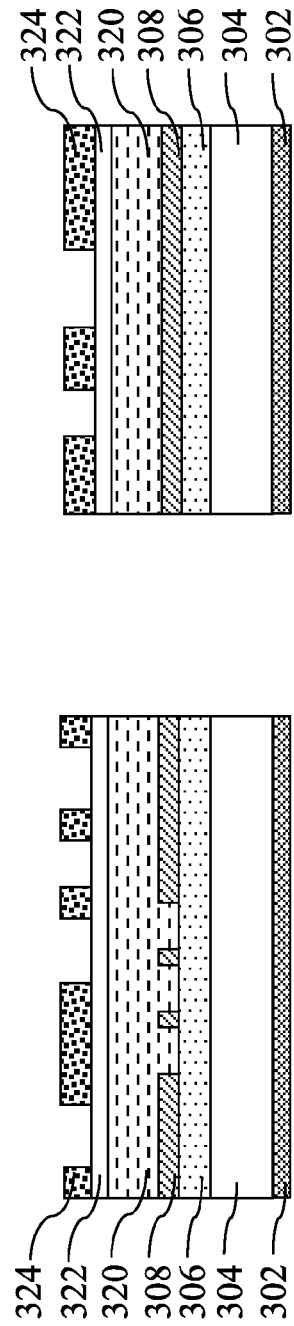
FIG. 7b
FIG. 7c

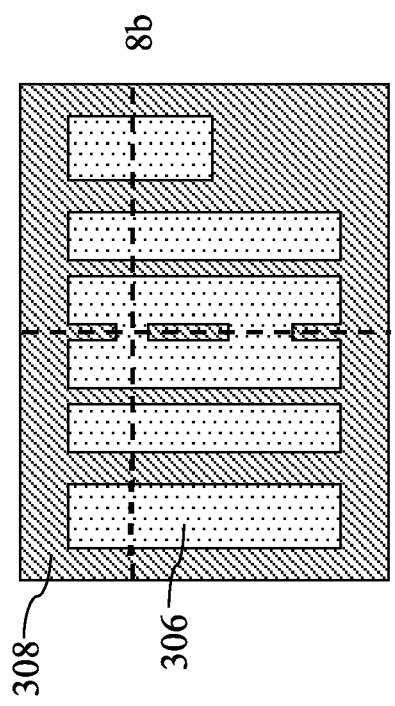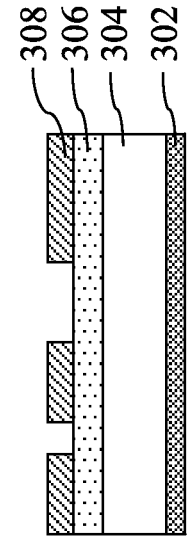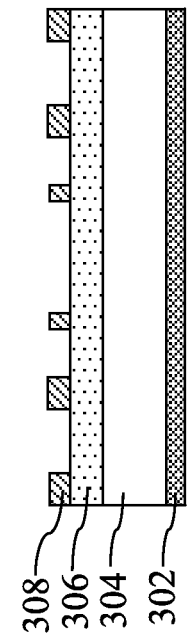

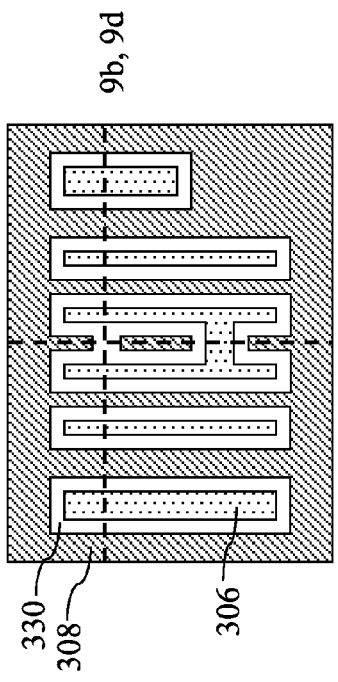
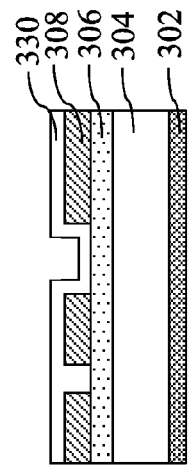
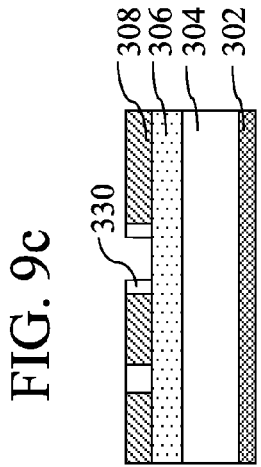
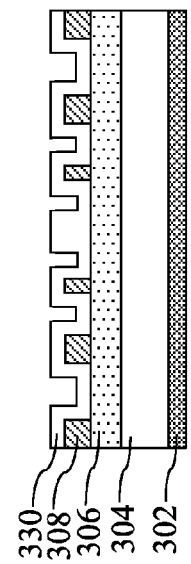
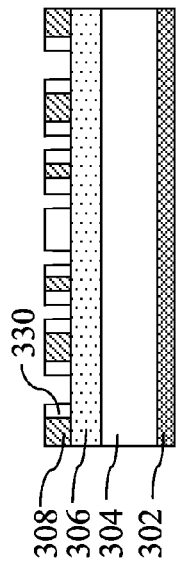

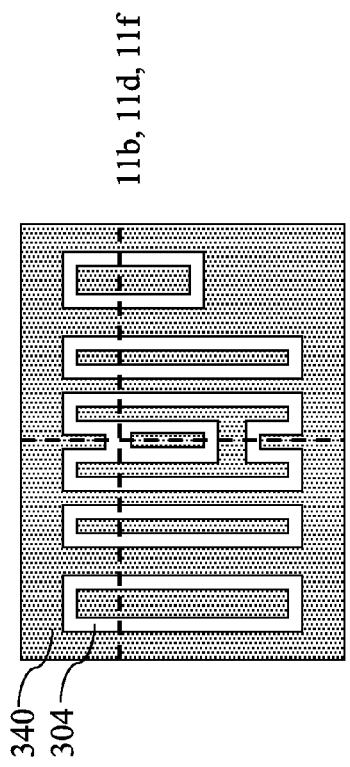
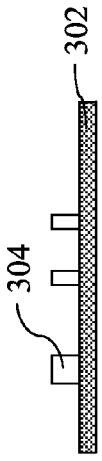
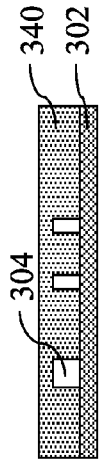
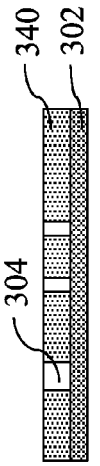
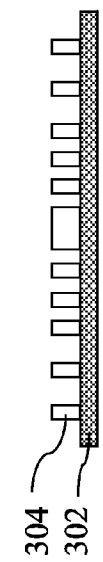
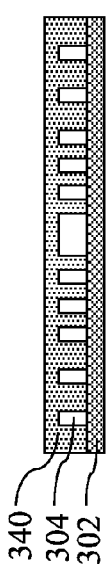

SPACER ETCHING PROCESS FOR INTEGRATED CIRCUIT DESIGN

This patent application claims the benefit of U.S. Provisional Application No. 61/791,138 entitled "Spacer Etching Process for Integrated Circuit Design" filed Mar. 15, 2013, herein incorporated by reference in its entirety. This patent application also hereby incorporates by reference U.S. patent application Ser. No. 13/892,945 entitled "A Method of Fabricating A FinFET Device" filed May 13, 2013.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, a spacer technique is often used to form mandrels, which are used in devices such as a fin field effect transistor (FinFET) device. Frequently, the spacer technique is used for doubling the exposed pattern in advanced lithography. That is, the pitch of a final pattern is reduced to only half compared with the first exposed pattern. Due to constraints from the lithography process, it is difficult to obtain small cut features.

Also in some occasions, it is desirable to have a large process window. The process window refers to a range of focus and exposure settings that will still produce the desired features into the photo-resist layer in the photolithographic process.

Accordingly, what is needed is an improvement in this area.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 also shows the target feature 208 being cut from the target feature 206 by a cut feature 214.

FIGS. 3a-5b illustrate the operations of forming the target pattern 200 according to the method of FIG. 1, in accordance with an embodiment.

FIGS. 6a-11g are top and cross sectional views of forming a device according to the method of FIG. 1, in accordance with an embodiment.

DETAILED DESCRIPTION

Figure 1:
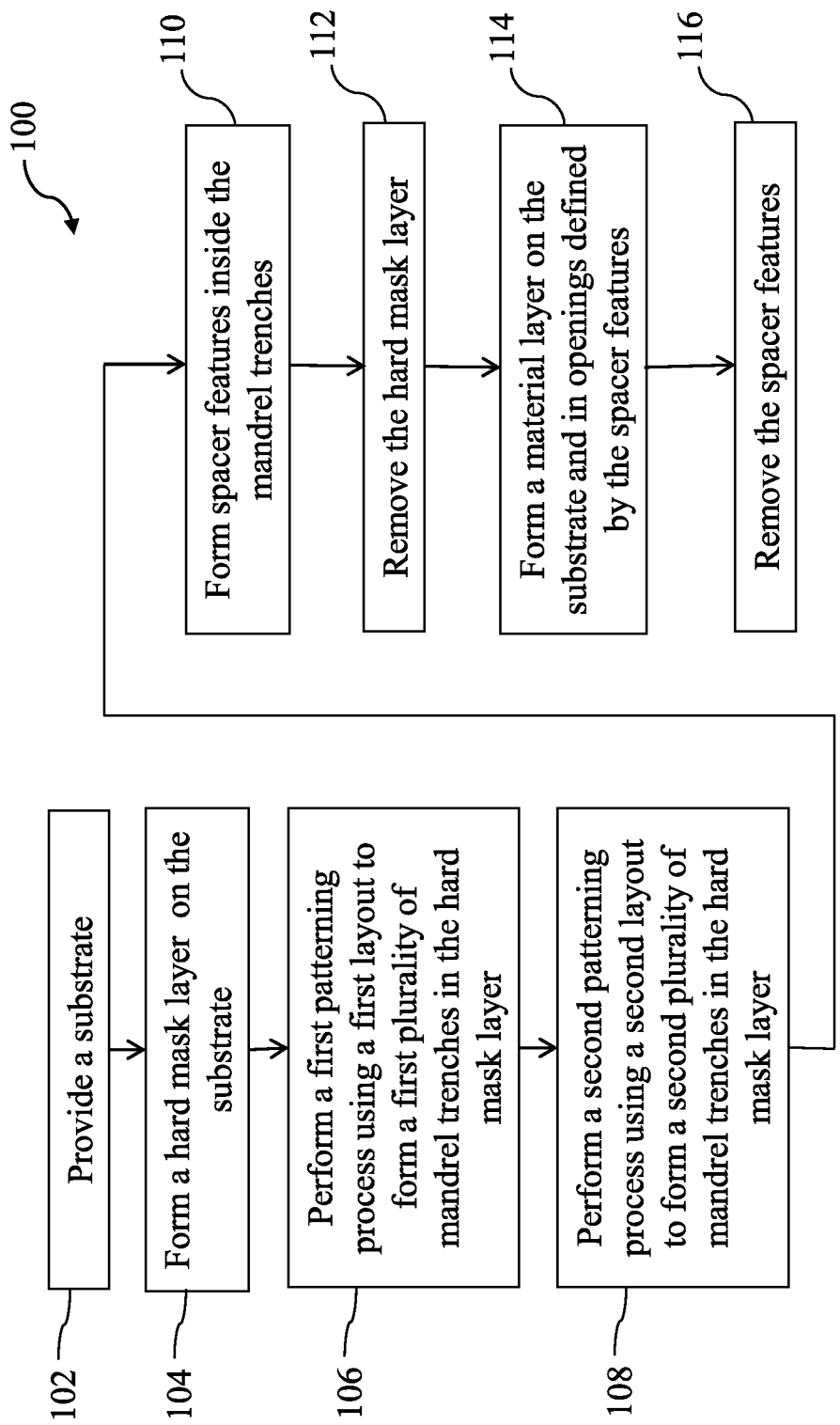
FIG. 1 is a flow chart of a method of forming a target pattern on a substrate for implementing one or more embodiments.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring now to FIG. 1, a flow chart of a method 100 for forming a target pattern is illustrated. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 will be further described below.

Figure 2:
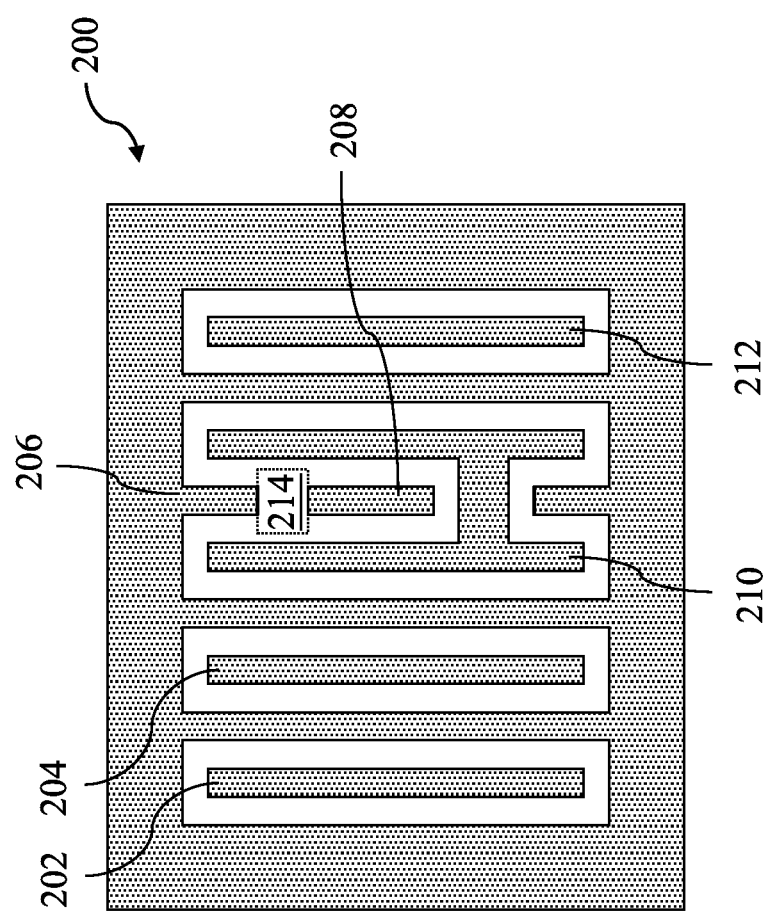
FIG. 2 shows a target pattern 200 with target features 202, 204, 206, 208, 210, and 212.

FIG. 2 is a diagram showing an example target pattern 200 including a number of target features 202, 204, 206, 208, 210, 212 and a cut feature 214. The target features may be, for example, metal lines. This target pattern 200 will be further described with reference to the additional figures of the patent, as discussed below.

Referring to FIGS. 1 and 3a, the method 100 begins at operation 102 by providing a substrate 218. The substrate 218 includes one or more material layers. In an embodiment, the substrate includes a semiconductor layer, a pad oxide layer, and a silicon nitride (SiN) layer. In an embodiment, the substrate includes a dielectric layer, an inter-layer dielectric layer such as an extreme low-k dielectric (ELK) layer, and an anti-reflection layer such as a nitrogen-free anti-reflection coating (NFARC) layer. In one example, the NFARC layer uses a material such as silicon oxide, silicon oxygen carbide, or plasma enhanced chemical vapor deposited silicon oxide.

The method 100 proceeds to operation 104 by forming a hard mask layer 220 on the substrate 218. The hard mask layer 220 may include one or more material layers and is formed by a procedure such as deposition. In an embodiment, the hard mask layer 220 may include silicon oxide formed by thermal oxidation. In an embodiment, the hard mask layer 220 may include SiN formed by chemical vapor deposition (CVD). For example, the hard mask layer 220 may be formed by CVD using chemicals including Hexachlorodisilane (HCD or Si2Cl6), Dichlorosilane (DCS or SiH2Cl2), Bis(TertiaryButylAmino)Silane (BTBAS or C8H22N2Si) and Disilane (DS or Si2H6).

Referring to FIGS. 1 and 3b, the method 100 proceeds to operation 106 by performing a first patterning process to the hard mask layer 220 using a first layout, thereby forming a first plurality of trenches, 222a, 222b, 222c, and 222d, in the hard mask layer 220, as illustrated in FIG. 3b. The first patterning process includes a lithography process and an etching process. In an embodiment, a resist layer, patterned with the first layout, is formed on the hard mask layer 220 using a lithography process, such as resist coating, soft baking, exposing, post-exposure baking (PEB), developing, and hard baking in one example. Then, the hard mask layer 220 is etched through the openings of the patterned resist layer, forming a plurality of trenches, 222a, 222b, 222c, and 222d, in the hard mask layer 220 by the etching process. The patterned resist layer is removed thereafter using a suitable process, such as wet stripping or plasma ashing. In one example, the etching process includes applying a dry (or plasma) etch to remove the hard mask layer 220 within the openings of the patterned resist layer.

Referring to FIGS. 1 and 3c, the method 100 proceeds to operation 108 by performing a second patterning process to the hard mask layer 220 using a second layout, thereby forming a second plurality of trenches, 224a, 224b, 224c, and 224d, in the hard mask layer 220, as illustrated in FIG. 3c.

In an embodiment, the second patterning process starts with forming a material layer over the hard mask layer 220 using one or more material different from the hard mask layer 220. For example, while the hard mask layer 220 uses silicon oxide or silicon nitride, the material layer may use bottom anti-reflective coating (BARC) or spin-on glass (SOG). The second patterning process further includes a lithography process and an etching process thereby forming the second plurality of trenches in the hard mask layer 220. In an embodiment, a resist layer, patterned with the second layout, is formed on the material layer using a lithography process. Then, the material layer and the hard mask layer 220 are etched through the openings of the patterned resist layer, forming a plurality of trenches in the hard mask layer 220 by the etching process. The patterned resist layer is removed thereafter using a suitable process, such as wet stripping or plasma ashing. The material layer is removed thereafter using a suitable process, such as an etching process tuned to selectively remove the material layer while the hard mask layer 220 remains.

Thus far, by performing operations 106 and 108 of the method 100, both the first plurality of mandrel trenches and the second plurality of mandrel trenches are formed on the hard mask layer 220, and portions of the first plurality of mandrel trenches and portions of the second plurality of mandrel trenches may merge.

Figure 4A:
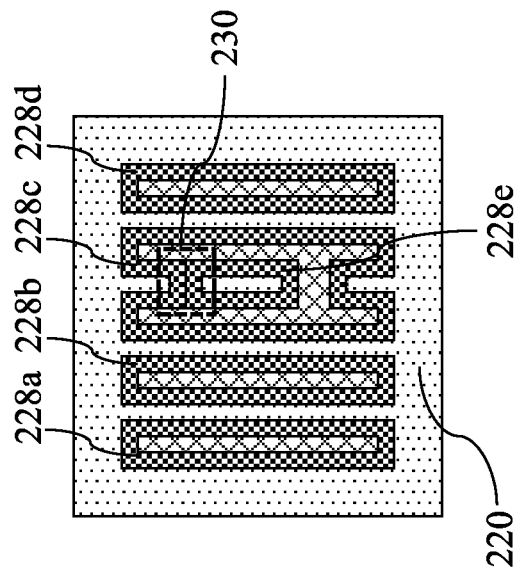

FIG. 4a shows the merged mandrel trenches in the hard mask layer 220 including mandrel trenches 226a, 222b, 226c, and 224d. The mandrel trench 226a is formed by merging mandrel trench 222a formed in operation 106 of the method 100 and mandrel trench 224a formed in operation 108 of the method 100. The mandrel trench 226c is formed by merging mandrel trenches 222c and 222d formed in operation 106 of the method 100 and mandrel trenches 224b and 224c are formed in operation 108 of the method 100.

Figure 4B:
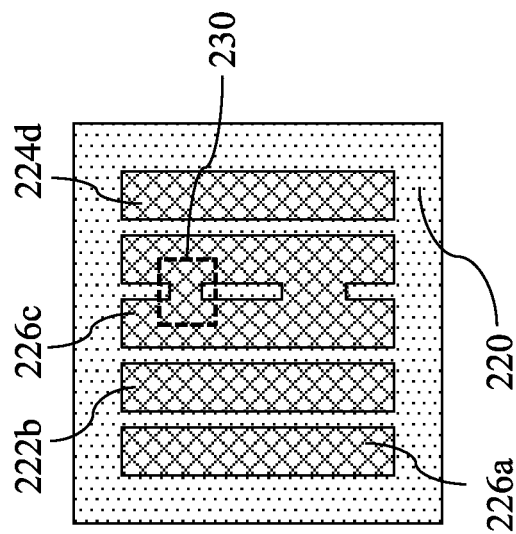

Referring to FIGS. 1 and 4b, after thus having formed the merged mandrel trenches in the hard mask layer, the method 100 proceeds to operation 110 by forming spacer features inside and on the sidewalls of the merged mandrel trenches, such as spacer features 228a, 228b, 228c, 228d, and 228e, as shown in FIG. 4b. The spacer features have a thickness. The spacer features include one or more materials different from the hard mask layer 220, such as titanium nitride (TiN). In addition or in the alternative, the spacer features may include a dielectric material, such as silicon oxide, silicon nitride, or silicon oxynitride. The spacer features can be formed by various processes, including a deposition process and an etching process. For example, the deposition process includes a CVD process or a physical vapor deposition (PVD) process. For example, the etching process includes an anisotropic etch such as plasma etch. Wherein width of the mandrel trenches is equal to or less than twice the thickness of the spacer features, spacer features merge inside the mandrel trenches. For example, referring to FIG. 4b, within a dotted box 230, spacer features 228c and 228e properly merge inside a mandrel trench.

The method 100 proceeds to operation 112 by removing the hard mask layer 220 through a suitable process, such as an etching process tuned to selectively remove the hard mask layer while the spacer features remain.

Figure 5B:
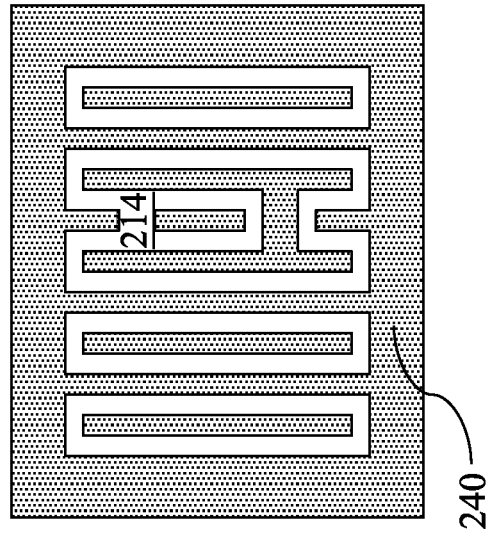
Figure 5A:
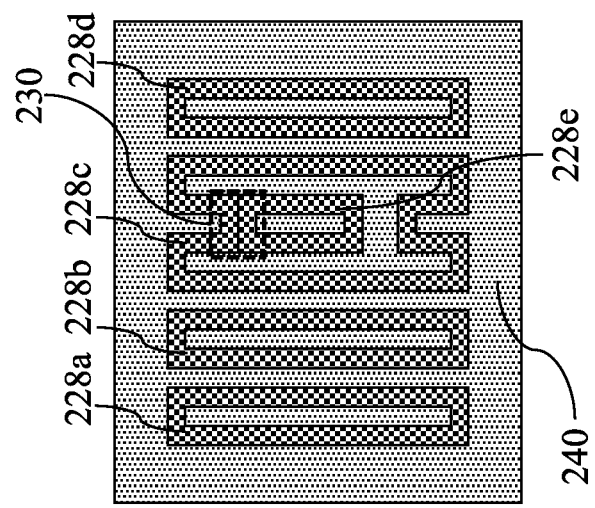
Figure 10A:
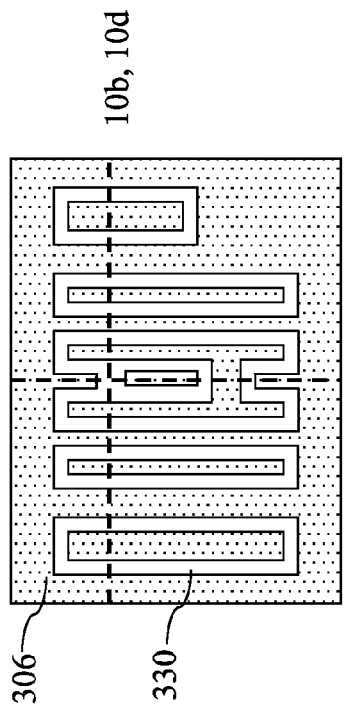
Figure 10C:
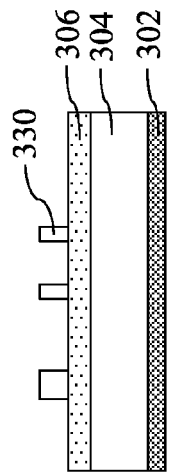
Figure 10E:
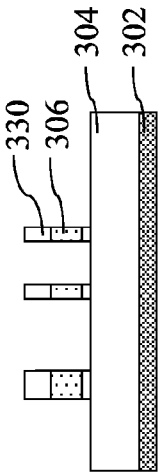
Figure 10B:
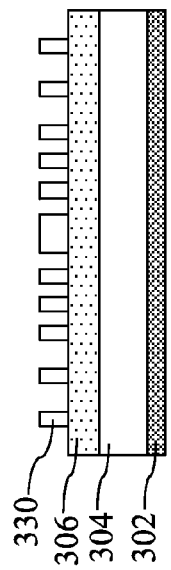
Figure 10D:
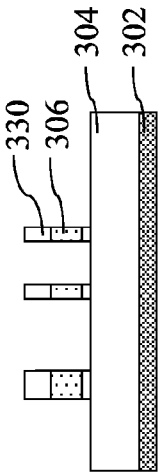

Referring to FIGS. 1 and 5a, the method 100 proceeds to operation 114 by forming a material layer 240 on the substrate and within openings defined by the spacer features 228a-e, as illustrated in FIG. 5a. In an embodiment, the material layer is deposited over the spacer features and is then partially removed such that the top surface of the spacer features is exposed by a procedure, such as chemical mechanical polishing (CMP) or etch back. In an embodiment, the material layer uses bottom anti-reflective coating (BARC) or spin-on glass (SOG).

The method 100 proceeds to operation 116 by removing the spacer features through a suitable process, such as an etching process tuned to selectively remove the spacer features while the material layer 240 remains. Wherein the width of the merged trenches is equal to or less than twice the thickness of the spacer features, a cut feature is formed after the spacer features are removed. FIG. 5b shows the spacer features 228a-e being removed, leaving a desired pattern on the substrate with a cut feature 214.

FIGS. 6a-11g show a process flow for a lithographic-spacer process with cut features according to a second embodiment of the present disclosure. In each of FIGS. 6a-11g, the figure designated "a" (e.g., FIG. 6a) includes a dotted line that defines cross sectional views for the figures designated "b," "c," and so on.

Referring to FIGS. 6a-6e, a first layout is formed in the hard mask layer 308 as mandrel trenches. In the present embodiment, a substrate includes a dielectric layer 302, an inter-layer dielectric (ILD) layer 304, and a nitrogen-free anti-reflection coating (NFARC) layer 306. A hard mask layer 308 is formed on the NFARC layer 306. A first bottom material layer 310, a first middle material layer 312, and a first resist layer 314 are formed for patterning the hard mask layer 308. In an embodiment, the ILD layer 304 includes an extreme low-k dielectric (ELK) material, the NFARC layer 306 includes a material such as silicon oxide, silicon oxygen carbide, or plasma enhanced chemical vapor deposited silicon oxide, the hard mask layer 308 includes silicon nitride, the bottom material includes a bottom anti-reflection coating polymeric material, and the middle material includes silicon containing polymer.

FIGS. 6b, 6c show the device with a patterned resist layer 314 according to the first layout as mandrel trenches. FIGS. 6d, 6e show the device after etching through the openings of the patterned resist layer 314 and thereafter removing the layers 314, 312, and 310, thereby forming a first plurality of trenches in the hard mask layer 308.

Referring to FIGS. 7a-7c, a second bottom material layer 320 is deposited over the hard mask layer 308, a second middle material layer 322 is deposited over the second bottom material layer 320, and a second resist layer 324 is patterned according to a second layout as mandrel trenches. The layers 322, 320, and 308 are to be etched through the openings of the patterned resist layer 324 to form a second plurality of trenches in the hard mask layer 308.

FIGS. 8a-8c show the merger of the first and second plurality of mandrel trenches in the hard mask layer 308 after etching the layers 322, 320, and 308 through the openings of the patterned resist layer 324 in FIGS. 7b and 7c, and removing the layers 324, 322, and 320 thereafter.

FIGS. 9a-9e show spacer features being formed inside and on sidewalls of the merged mandrel trenches. FIGS. 9b, 9c show a spacer material 330 being deposited over the hard mask layer 308 and on the NFARC layer 306. In one example, the spacer material includes titanium nitride. FIGS. 9d, 9e show the spacer material 330 from the horizontal surfaces away from the mandrel sidewalls being removed, such as by an anisotropic etch process, thereby forming spacer features on the sidewalls of the mandrel trenches.

FIGS. 10a-10e show the hard mask layer 308 being removed, as well as portions of the NFARC layer 306 and the ILD layer 304, with the spacer features formed in FIGS. 9a-9e being used as a mask. This can be done by a suitable process, such as an anisotropic etch process.

FIGS. 11a-11g show the desired final pattern being formed in the ILD layer 304 on the dielectric layer 302. FIGS. 11b, 11c show the spacer features 330 and NFARC layer 306 being removed, leaving only the patterned ILD layer 304 on the dielectric layer 302. This can be done by one or two etching processes, selective to the spacer material and the NFARC material. FIGS. 11d, 11e show a material 340 deposited over the patterned ILD layer 304. For example, the material 340 can be copper, tungsten or silicide for forming metal lines. FIGS. 11f, 11g show the deposited material 340 being planarized to form the final device. This can be done with an etching or chemical mechanical polishing (CMP) process.

Accordingly, the present disclosure provides a method of forming a target pattern or device by performing a first and a second lithography processes to form mandrel trenches in a hard mask layer, and thereafter performing spacer and etching processes.

Although not intended to be limiting, an advantage of one or more embodiments of the present disclosure is that the second layout can be used as not only either a main feature or a cut feature of the target pattern, but also both of them after proper process scheme. That is, the second layout can be used as a new mandrel, a merged portion of the first layout, or a cut feature for the first layout so as to achieve a desirable uniformity in density for lithographic exposure. The desirable uniformity in pattern density improves lithography process window. Therefore, the present disclosure is lithography friendly for forming small cut features. Moreover, the second layout may be used either before or after the first layout in performing the method 100 to achieve same result. The new process can be referred to as LLSE (lithography, lithography, spacer, etch). This LLSE process has the advantage of the conventional LELE processes, and has the capability of making smaller cut features.

Figure 12B:
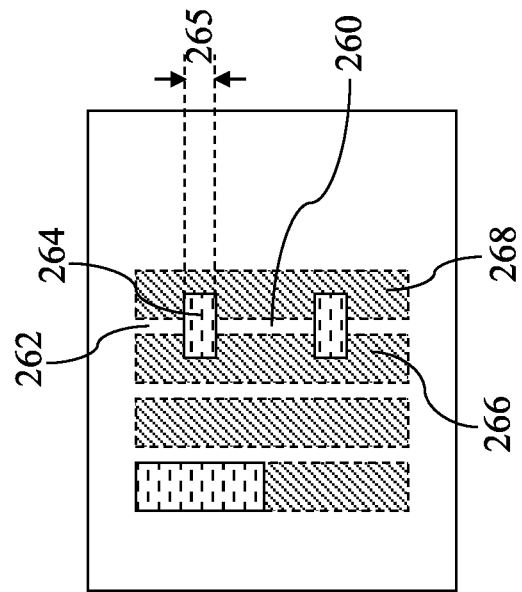
FIGS. 12a and 12b illustrate the minimum cut feature with two embodiments.
Figure 12A:
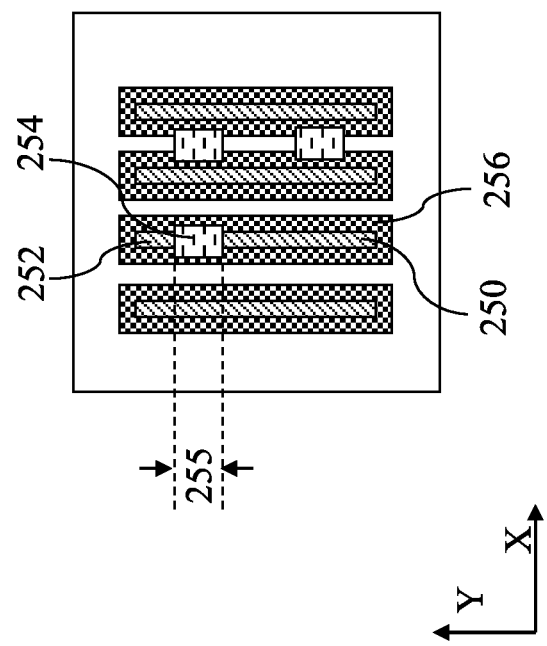

FIGS. 12a, 12b illustrate one improvement achieved by the present disclosure over a LELE process. For simplicity purposes, a dimension of a feature in direction X is referred to as the width of the feature, and a dimension of a feature in direction Y is referred to as the length of the feature.

Referring now to FIG. 12a, in a LELE process, a mandrel line within a spacer 256 is cut to two mandrel lines 250 and 252 by a cut feature 254. A distance 255 between one end of mandrel line 250 and one end of mandrel line 252 is referred to as an End-to-End (EtE) feature which is limited by the length of cut feature 254. Since the width of cut feature 254 is constrained by the width of the spacer 256, the minimum length of cut feature 254 is limited by the lithography process.

Referring now to FIG. 12b, in an embodiment of the present disclosure, a cut feature 264 is formed as a trench in a second lithography process over two mandrel trenches 266 and 268 formed in a first lithography process. A distance 265 between one end of a target feature 262 and one end of a target feature 260 is referred to as an End-to-End (EtE) feature, which is limited by the length of cut feature 264. The width of cut feature 264 is constrained within two mandrel trenches 266 and 268. Because the width of mandrel trenches 266 and 268 is substantially larger than the width of spacer 256 from FIG. 12a, the width of cut feature 264 can be substantially larger than the width of cut feature 254 from FIG. 12a. As a result, the length of cut feature 264 can be substantially smaller than the length of cut feature 254 for the same lithography process. Hence, a smaller EtE feature is achieved by an embodiment of the present disclosure.

Thus, the present disclosure provides an embodiment of a method of forming a target pattern. The method includes forming a first material layer on a substrate; performing a first patterning process using a first layout to form a first plurality of trenches in the first material layer; performing a second patterning process using a second layout to form a second plurality of trenches in the first material layer; forming spacer features on sidewalls of both the first plurality of trenches and the second plurality of trenches, the spacer features having a thickness; removing the first material layer; etching the substrate using the spacer features as an etch mask; and thereafter removing the spacer features. The target pattern is to be formed with the first layout and the second layout.

The present disclosure also provides another embodiment of a method of forming a target pattern on a substrate. The method includes forming a first material layer on the substrate; performing a first patterning process using a first layout to form a first plurality of trenches in the first material layer; performing a second patterning process using a second layout to form a second plurality of trenches in the first material layer; forming spacer features on sidewalls of both the first plurality of trenches and the second plurality of trenches, the spacer features having a thickness; removing the first material layer; forming a second material layer on the substrate and within openings defined by the spacer features; and removing the spacer features. The target pattern is to be formed with the first layout and the second layout.

The present disclosure provides yet another embodiment of A method of forming a target pattern. The method includes depositing a first material layer on a substrate; performing a first lithography patterning process using a first layout to form a first plurality of trenches in the first material layer; performing a second lithography patterning process using a second layout to form a second plurality of trenches in the first material layer; forming spacer features on sidewalls of both the first plurality of trenches and the second plurality of trenches using a process including deposition and etching, the spacer features having a thickness; removing the first material layer by an etching process; etching the substrate using the spacer features as an etch mask; and thereafter removing the spacer features using one of: an etching process and a polishing process. The target pattern is to be formed with the first layout and the second layout; the first layout includes a first subset of the target pattern; the second layout includes a second subset of the target pattern and a cut pattern for the first subset; and the cut pattern corresponds to a portion of the second layout wherein width of the second layout is less than twice the thickness of the spacer features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a target pattern for an integrated circuit, the method comprising:
    forming a first material layer on a substrate;
    performing a first patterning process using a first layout to form a first plurality of trenches in the first material layer, the first layout including a first subset of the target pattern;
    performing a second patterning process using a second layout to form a second plurality of trenches in the first material layer, the second layout including a second subset of the target pattern and a cut pattern for the first subset;
    forming spacer features on sidewalls of both the first plurality of trenches and the second plurality of trenches, the spacer features having a thickness, wherein the cut pattern corresponds to a first trench of the second plurality whose width is less than twice the thickness of the spacer features;
    removing the first material layer;
    etching the substrate using the spacer features as an etch mask; and
    thereafter removing the spacer features;
    wherein the target pattern is formed with the first layout and the second layout.

2. The method of claim 1, wherein a portion of the first plurality of trenches is merged with a portion of the second plurality of trenches.

3. The method of claim 1, wherein performing the first patterning process using the first layout includes:
    forming a second material layer over the first material layer;
    forming a resist layer over the second material layer;
    patterning the resist layer using the first layout thereby resulting in a resist pattern; and
    transferring the resist pattern to the first material layer; wherein the second material is different from the first material.

4. The method of claim 3, wherein:
    the first material includes silicon nitride;
    the second material layer includes a bottom layer and a middle layer;
    the bottom layer includes a bottom anti-reflection coating polymeric material; and
    the middle layer includes silicon-containing polymer.

5. The method of claim 3, wherein transferring the resist pattern to the first material layer includes:
    etching the second material layer using the resist pattern as an etch mask to expose the first material layer;
    removing the resist layer;
    etching the first material layer using the second material layer as an etch mask to expose the substrate; and
    thereafter removing the second material layer.

6. The method of claim 1, wherein performing the second patterning process using the second layout includes:
    forming a second material layer over the first material layer;
    forming a third material layer over the second material layer;
    forming a resist layer over the third material layer;
    patterning the resist layer using the second layout, thereby resulting in a resist pattern; and
    transferring the resist pattern to the first material layer; wherein:
    the second material is different from the first material; and
    the third material is different from the second material.

7. The method of claim 6, wherein:
    the first material includes silicon nitride;
    the second material includes a bottom anti-reflection coating polymeric material; and
    the third material includes silicon-containing polymer.

8. The method of claim 6, wherein transferring the resist pattern to the first material layer includes:
    etching the third material layer using the resist pattern as an etch mask to expose the second material layer;
    removing the resist layer;
    etching the second material layer using the patterned third material layer as an etch mask to expose the first material layer;
    removing the third material layer;
    etching the first material layer using the patterned second material layer as an etch mask to expose the substrate; and
    thereafter removing the second material layer through an etching process selectively tuned to remove the second material while the first material remains.

9. The method of claim 1, wherein forming the spacer features includes:
    depositing a spacer material over the first material layer and on the substrate; and
    applying an anisotropic etching process to the spacer material.

10. The method of claim 1, wherein:
    the spacer material includes titanium nitride;
    the first material includes silicon nitride;
    the substrate includes a nitrogen-free anti-reflection coating layer over an extreme low-k dielectric layer; and
    the nitrogen-free anti-reflection coating layer includes a material selected from the group consisting of silicon oxide, silicon oxygen carbide, and plasma enhanced chemical vapor deposited silicon oxide.

11. A method of forming a target pattern, the method comprising:
- depositing a first material layer on a substrate;
- performing a first lithography patterning process using a first layout to form a first plurality of trenches in the first material layer;
- performing a second lithography patterning process using a second layout to form a second plurality of trenches in the first material layer;
- forming spacer features on sidewalls of both the first plurality of trenches and the second plurality of trenches using a process including deposition and etching, the spacer features having a thickness;
- removing the first material layer by an etching process;
- etching the substrate using the spacer features as an etch mask; and
- thereafter removing the spacer features using one of: an etching process and a polishing process;

wherein:
- the target pattern is formed with the first layout and the second layout;
- the first layout includes a first subset of the target pattern;
- the second layout includes a second subset of the target pattern and a cut pattern for the first subset; and
- the cut pattern corresponds to a portion of the second layout wherein a width of the portion of the second layout is less than twice the thickness of the spacer features.

12. The method of claim 11, wherein a portion of the first plurality of trenches is merged with a portion of the second plurality of trenches.

13. The method of claim 11, wherein:
- the spacer material includes titanium nitride;
- the first material includes silicon nitride;
- the substrate includes a nitrogen-free anti-reflection coating layer over an inter-layer dielectric layer; and
- the nitrogen-free anti-reflection coating layer uses a material selected from the group consisting of silicon oxide, silicon oxygen carbide, and plasma enhanced chemical vapor deposited silicon oxide.

14. The method of claim 13, further comprising, forming conductive lines over the substrate using a process including a deposition process and a polishing process, wherein:
- the etching of the substrate includes etching the inter-layer dielectric layer thereby forming trenches in the inter-layer dielectric layer;
- the deposition process includes filling the trenches in the inter-layer dielectric layer with a conductive material; and
- the polishing process includes a chemical mechanical polishing process.

15. The method of claim 11, further comprising forming an anti-reflection coating layer over the substrate prior to depositing the first material layer on the substrate.

16. The method of claim 11, wherein one of the first plurality of trenches interfaces with one of the second plurality of trenches to form a continuous trench.

17. The method of claim 16, wherein forming spacer features on sidewalls of both the first plurality of trenches and the second plurality of trenches includes forming the spacer feature in the continuous trench.

18. A method of forming a target pattern for an integrated circuit, the method comprising:
- forming a first material layer on a substrate;
- performing a first patterning process using a first layout to form a first plurality of trenches in the first material layer;
- performing a second patterning process using a second layout to form a second plurality of trenches in the first material layer, wherein a first trench of the second plurality merges with two trenches of the first plurality;
- forming spacer features on sidewalls of both the first plurality of trenches and the second plurality of trenches, the spacer features having a thickness, wherein a width of the first trench is less than twice the thickness of the spacer features thereby the spacer features merge inside the first trench;
- removing the first material layer; and
- etching the substrate using the spacer features as an etch mask;
- wherein the target pattern is formed with the first layout and the second layout.

19. The method of claim 18, wherein a second trench of the second plurality merges with the two trenches of the first plurality and the second trench has a width greater than twice the thickness of the spacer features.

20. The method of claim 18, wherein a second trench of the second plurality merges with another trench of the first plurality to form a continuous trench.

* * * * *